United States Patent
Daellenbach

(10) Patent No.: US 7,966,597 B2
(45) Date of Patent: Jun. 21, 2011

(54) METHOD AND SYSTEM FOR ROUTING OF INTEGRATED CIRCUIT DESIGN

(75) Inventor: Lukas Daellenbach, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 12/122,259

(22) Filed: May 16, 2008

(65) Prior Publication Data

US 2008/0301618 A1  Dec. 4, 2008

(30) Foreign Application Priority Data

Jun. 1, 2007 (EP) .................................... 07109415

(51) Int. Cl.
*G06F 17/50* (2006.01)
(52) U.S. Cl. .................... 716/129; 716/126; 716/130
(58) Field of Classification Search .............. 716/8, 9, 716/10, 12, 13, 14, 126, 129, 130
See application file for complete search history.

(56) References Cited

U.S. PATENT DOCUMENTS

| | | | |
|---|---|---|---|
| 5,629,860 A * | 5/1997 | Jones et al. | 716/6 |
| 6,598,206 B2 * | 7/2003 | Darden et al. | 716/2 |
| 7,076,758 B1 * | 7/2006 | Srinivasan et al. | 716/11 |
| 2005/0108444 A1 * | 5/2005 | Flauaus et al. | 710/15 |

* cited by examiner

*Primary Examiner* — Sun J Lin
(74) *Attorney, Agent, or Firm* — Dennis Jung

(57) ABSTRACT

The invention relates to a method and a system for routing electric circuits in integrated circuit chip design. Specifically, the invention encompasses the steps of performing a congestion analysis for a given routed placement of cells containing said electric circuits on a chip; defining a critical area on said chip based on congestion information; analyzing actual wiring quality within said critical area; comparing an actual wiring quality of said critical area with a reference wiring quality of said critical area; and rerouting said critical area based on a comparison between the actual wiring quality and the reference wiring quality.

14 Claims, 4 Drawing Sheets

METHOD AND SYSTEM FOR ROUTING OF INTEGRATED CIRCUIT DESIGN

FIELD OF THE INVENTION

The invention relates to the design of very large scale integrated (VLSI) circuits. Specifically, the invention provides a method and a system for improving routing of electric circuits on a chip in such a way as to decrease local wiring congestion and to enhance wiring resources in congested areas.

BACKGROUND OF THE INVENTION

In the manufacture of microelectronics, circuits and other logic must be placed on chips and routed under certain wireability and timing constraints. Specifically, the electric circuits must be placed and routed in such a way that all wiring corresponding to the nets joining the electric circuits can be placed and connected as required. As a rule, routing begins after a floorplan has been laid out and the electric circuits have been placed on the chip. Routing is generally split into a global routing step followed by a detailed routing step. During global routing, a complete set of instructions is provided according to which the detailed router is to place actual wiring of every net. The objectives of global routing include a minimization of total interconnect length, a maximization of the probability that the detailed router can complete the routing, and a minimization of critical path delay. Thus, the global routing step determines the channels to be used for each interconnect. Using this information, the detailed router determines the exact location and layers for each interconnect. Depending on the quality of placement and of global routing as well as on local wiring requirements, detailed routing often produces local areas with inferior quality of wiring which unnecessarily crowds the wiring channels and has a negative effect on the design's performance. Such inferior wiring quality includes unconnects (i.e. nets which could not be connected by wiring) as well as so-called scenic routes (i.e. nets which, instead of following minimizing wiring length with long straight segments and few changes of wire level, are composed of many small segments and contain many vias). This kind of inferior quality wiring usually only occurs in relatively small congested areas. In addition to diminishing the design's performance, unconnects and scenic routes squander routing resources, contribute to wiring congestion and can cause "hot spots" on the chip which can lead to overload and failure thereof. The situation is aggravated in the presence of multi-segment nets which underlie a strong requirement to use redundant vias, thus causing additional blockade and making the congestions even worse.

In the past, local wiring improvement was mostly performed manually, requiring a considerable amount of time-consuming interaction by the designer. As an example, FIG. 1 depicts a method flow diagram illustrating conventional wiring improvement: After global and detailed routing 252, 254 of electric circuits in a given placement of cells, an analysis 256 of the routed design was carried out to determine whether critical parameters of the design (such as timing, connection quality etc.) met specifications. If critical parameters were not satisfactory, manual steps 258 were performed, trying to locally "repair" deficient routing results. In the case of unconnects, manual interaction or retries were necessary, because otherwise the local router was unable to finish all routes. If slew and slack timing requirements were not met (due to scenic routes, bad wiring levels etc.), certain nets had to be manually rerouted (step 260), e.g. by straightening nets. All such manipulations were carried out on a trial-and-error basis, making them highly time-consuming and tending to result in unacceptable delays in chip development. Even though some routers comprise "clean steps" features, these were found to often leave the wiring in a worse state than before.

In view of the foregoing, there is a need for an improved method and a system for routing connections between electric circuits on a chip in such a way as enhance wiring resources in congested areas while at the same time limiting wiring congestion.

SUMMARY OF THE INVENTION

It is an object of the invention to provide a method and system for routing electric circuits in integrated chip design in such a way as to improve local wiring quality.

These objects are achieved by the features of the independent claims. The other claims and the specification disclose advantageous embodiments of the invention.

According to a first aspect of the invention, a method for routing electric circuits in integrated circuit chip design is provided which evaluates wiring quality within a given local area, compares this to a reference wiring quality and substitutes some (or all) wiring in the local area subject to this comparison. The method comprises the steps of (1) performing a congestion analysis for a given routed placement of cells containing electric circuits on a chip; (2) defining a critical area on the chip based on congestion information; (3) analyzing the actual wiring quality within the critical area; (4) comparing the actual wiring quality to a reference wiring quality in the critical area and (5) rerouting the critical area based on a comparison between actual wiring quality and reference wiring quality.

According to a second aspect of the invention, a system for placing electric circuits on a chip is provided. The system comprises (1) a placement system for placing cells containing electric circuits on a chip; (2) a routing system for global routing of the cells on the chip as well as for detailed routing of the electric circuits and (3) a rerouting system, where the rerouting system comprises (3a) a congestion analysis system for defining a critical area on the chip based on congestion information; (3b) a wiring analysis system for analyzing wiring quality within the critical area with respect to reference wiring quality and (3c) a route replacement system (316) for rerouting critical area (14).

Advantageously the invention exploits a congestion analysis, notably wiring and congestion information from a global routing step, to diagnose locally congested areas. In a preferred embodiment, a locally congested area is analyzed with respect to via count, number of segments and wire level. The result of this analysis is compared to reference wiring quality calculated as the Manhattan distance for internal and partial nets within the locally congested area. By applying a small and fast router priorized to follow Manhattan distance, nets are straightened, and via count as well as number of segments is reduced.

BRIEF DESCRIPTION OF THE DRAWINGS

The present invention together with the above-mentioned and other objects and advantages may best be understood from the following detailed description of the embodiments, but not restricted to the embodiments, in conjunction with the accompanying drawings which show.

Figure 1:
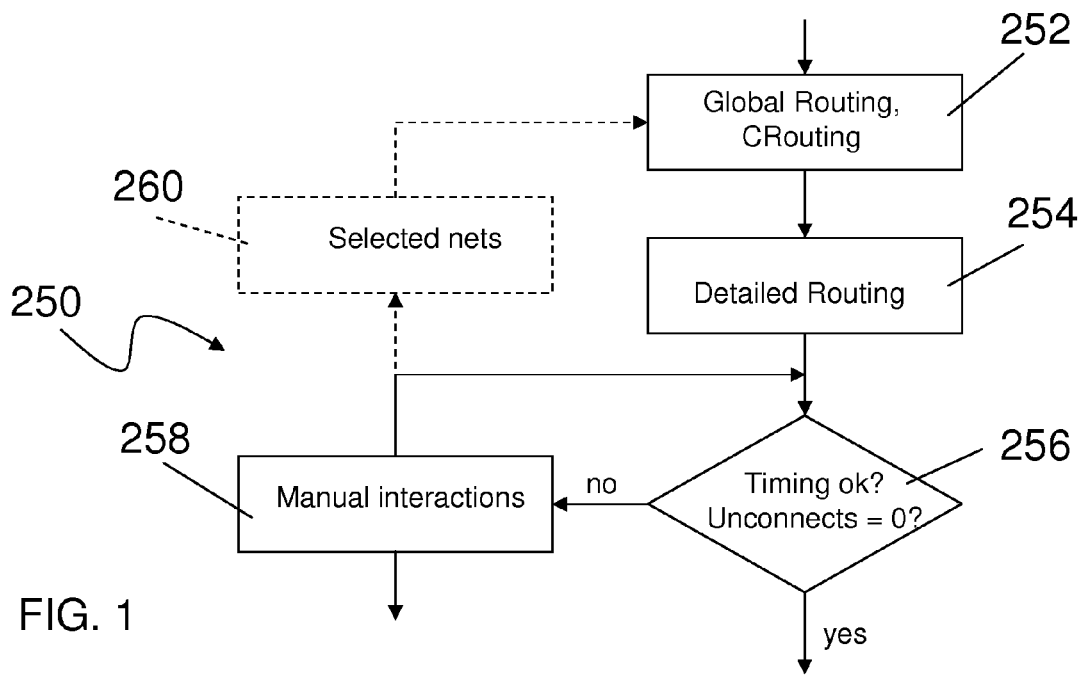
FIG. 1 a method flow diagram of a conventional method of improving wiring quality of a routed placement of electric circuits (state of the art)

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention. In the drawings, like elements are referred to with equal reference numerals.

DETAILED DESCRIPTION OF THE INVENTION

Generally, the present invention provides a method for rerouting a cell design comprising electric circuits, transistors etc. on a chip in such a way that wiring congestion can be reduced. More specifically, the invention provides a method of improving local wiring quality, especially by straightened wiring in critical areas and replacing inferior quality wiring such as unconnects, scenic routes etc.

Figure 2:
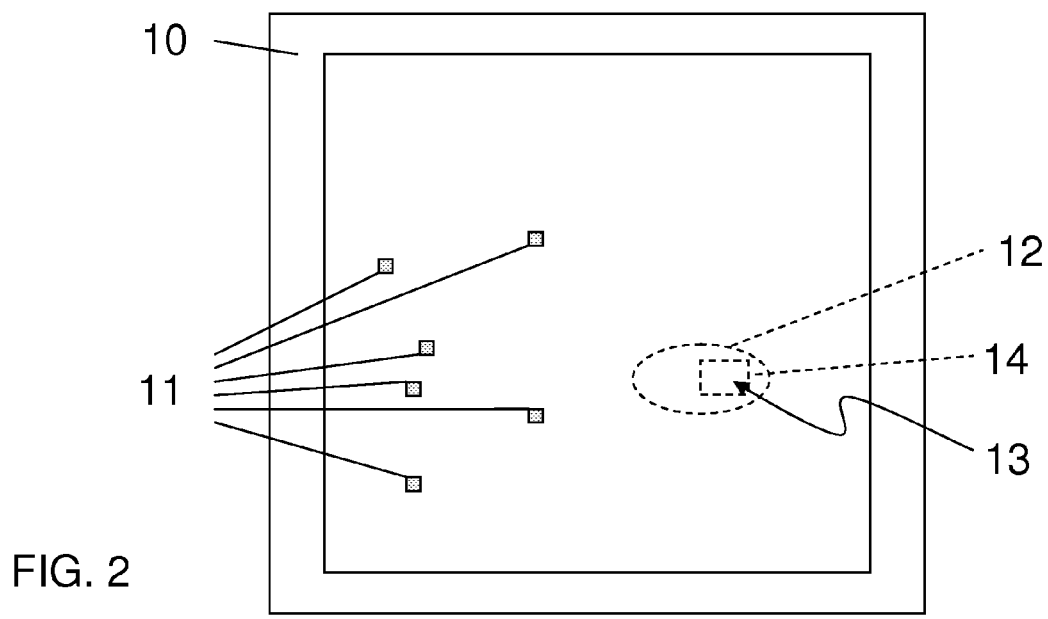
FIG. 2 a chip with cells comprising electric circuits and an area with wiring congestions.

FIG. 2 shows a schematic view of a chip 10 containing a multitude of cells 11 of which only a tiny fraction is shown in FIG. 2. The process of positioning and arranging the cells on the chip starts out from a netlist which comprises a description of the cells 11 and their connections. A system partitioning step divides a large system into blocks, and a floorplanning step arranges the blocks of the netlist on the chip.

In a subsequent placement step, the cells 11 are exactly positioned on the chip 10. The objective of the placement step consists in distributing the cells 11 on the chip 10 in such a way as to guarantee that routing of all cells 11 can be completed while fulfilling other criteria such as minimizing interconnect length, minimizing critical net delays and making the chip 10 as dense as possible. The placement of the cells can be accomplished using quadratic optimization, min-cut or any other known operation. Moreover, placement can be performed taking into account wiring availability, e.g. by using a method based on estimated wiring congestion as described in U.S. Pat. No. 6,904,584 B2.

Once the cells 11 have been exactly positioned on the chip, a global routing step, based on a routing graph of the design, roughly designates the areas in which detailed routing will later place the interconnections. Thus, global routing reduces the search area for detailed routing. Typically, an input for the global router is a floorplan that includes the locations of all the fixed and flexible blocks, the placement information of the flexible blocks and the locations of all the cells. The goal of global routing is to provide a complete set of instructions to the detailed router on where to route every net. This should be done with minimizing the total interconnect length, by maximizing the probability that the detailed router can complete the routing and by minimizing the critical path delay.

The global routing step determines the channels to be used for each interconnect and generates virtual wiring. Based on this virtual wiring, a croute step is carried out to optimize the virtual wiring and limit wiring to a minimum number of wiring layers. Using the virtual wiring generated by the global routing and the croute step, the detailed router decides the exact location and layers for each interconnect. The detailed router has to meet the challenge of wiring the large area of the chip in a fast, efficient and complete way.

Depending on the quality of routing, one or more critical areas of wiring congestion, so called meshes 13, may occur on the chip 10. One such mesh 13 is indicated in FIG. 2. Within these meshes 13, wiring requirements exceed wiring availability, leading to wiring congestion which can result in overload and failure of the chip 10. Meshes 13 with wiring overload can be detected after performing the global routing step (e.g. by calculating an estimated wiring congestion) as well as after performing the detailed routing step (e.g. by calculating the actual wiring). In a preferred embodiment of the invention, information from the global routing step is used to pinpoint congested areas to find meshes 13.

According to the present invention, meshes 13 containing wiring overload are locally rerouted in such a way as to improve wiring quality within a critical area 14 containing this mesh 13. For reasons of speed and efficiency these critical areas 14 should be quite small. If wiring congestion afflicts a region 12 exceeding a certain predetermined size, region 12 will be partitioned into several critical areas 14, and rerouting will be performed for each of these critical areas 14 separately.

Figure 3A:
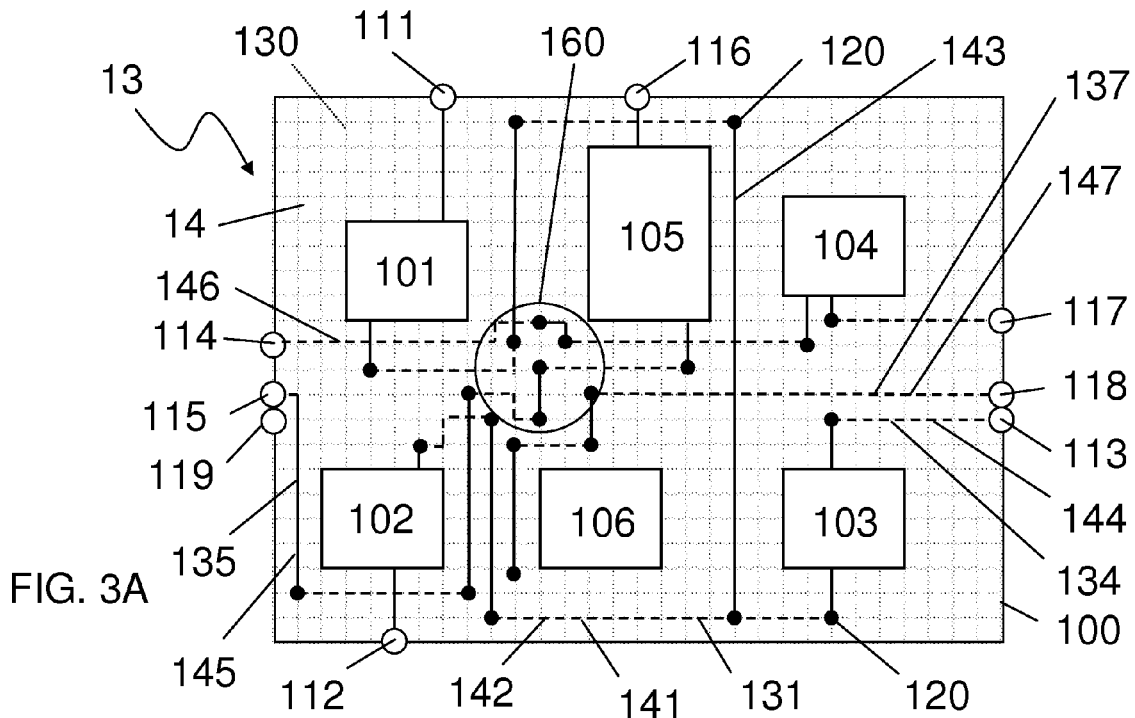
FIG. 3A a detailed view of an area of a chip after routing.

Before rerouting the critical area 14, the actual wiring quality of critical area 14 containing mesh 13 is evaluated and compared with a reference wiring quality of this critical area 14. As an example, FIG. 3A depicts a detailed view of critical area 14 which, for reasons of demonstration, contains only six cells 101 through 106 residing in the first wiring level M1. In general, the critical area 14 can contain several hundreds of cells (or even more) which can reside in different wiring levels. In the entirely schematic example of FIG. 3A, M1 is used for vertical routing, illustrated as solid lines in FIG. 3A. Horizontal routing is located in the second wiring level M2 and is illustrated in phantom. Vias 120, depicted as solid points in FIG. 3A, provide electric connections between wiring levels M1 and M2. A square grid 130 indicates units of length in both horizontal and vertical direction. Even though the critical area 14 of FIG. 3A is rectangular in shape, more generally the critical area can have any shape, e.g. as defined by outcome of a congestion analysis or manually defined by user.

Critical area 14 is bordered by edges 100 and contains a multitude of nets, some of which connect cells 101 through 106 to other cells within or outside critical area 14. Some of the nets within critical area 14 are internal nets (i.e. nets which are entirely contained in critical area 14), other nets are partial nets (i.e. nets which extend to sinks and sources outside critical area 14); Transition points 111-119 indicate locations in which partial nets of critical area 100 cross the edge 100 of critical area 14. For reasons of clarity, only a small fraction these nets are shown in FIG. 3A.

Cells 101, 102 and 103 are linked by internal net 131. The actual wiring implementation 141 of net 131 shown in FIG. 3A constitutes a miniature example of a scenic route since one of its branches 142 circles cell 105 clockwise while another one of its branches 143 circles cell 105 counterclockwise. Partial net 134 links cell 103 to a cell outside critical area 14; its actual implementation 144 as depicted in FIG. 3A crosses the edge 100 of critical area 14 in transition point 113.

Partial net 135 links cell 105 to a cell outside critical area 14; its actual implementation 145 as depicted in FIG. 3A crosses the edge 100 of critical area 14 in transition point 115. This implementation 145 of partial net 135 contains numerous, albeit small, detours as well as a plurality of changes in wiring level, thus needing a plurality of "unnecessary" vias. Similarly, implementation 146 of a partial net connecting cell 104 to transition point 114 contains a detour with two "unnecessary" vias. Note that the detours of implementations 145, 146 lead to excessive wiring in an area 160, thus wasting precious space which could otherwise be used for additional wiring.

Partial net 137 is meant to link transition point 118 to transition point 119. Note that this partial net 137 is not implemented correctly in FIG. 3A: Rather than forming a connection between the transition points 118, 119, wiring segment 147 constitutes an unconnect, since it has a loose end which cannot be linked to transition point 119. This is due to the fact that implementation 145 of net 135 blocks transition point 119 by using the same wiring layer. As a consequence, no connection between transition points 118 and 119 can be made.

When evaluating the actual wiring quality of critical area 14, critical area 14 can be analyzed for example with respect to via 120 count, number of segments of (partial and internal) nets within critical area 14, wiring lengths of nets within critical area 14, wire level etc. In the example of FIG. 3A, actual wiring implementation 141 of internal net 131 has a wiring length of 76 units and contains nine vias joining ten segments of wiring. Actual wiring implementation 144 of partial net 134 contained within critical area 14 has a wiring length of nine units and one via joining two segments of wiring. By summing up the total wiring length and/or number of vias and/or the number of segments within critical area 14, a measure characterizing the actual wiring quality of critical area 14 is obtained.

Figure 3B:
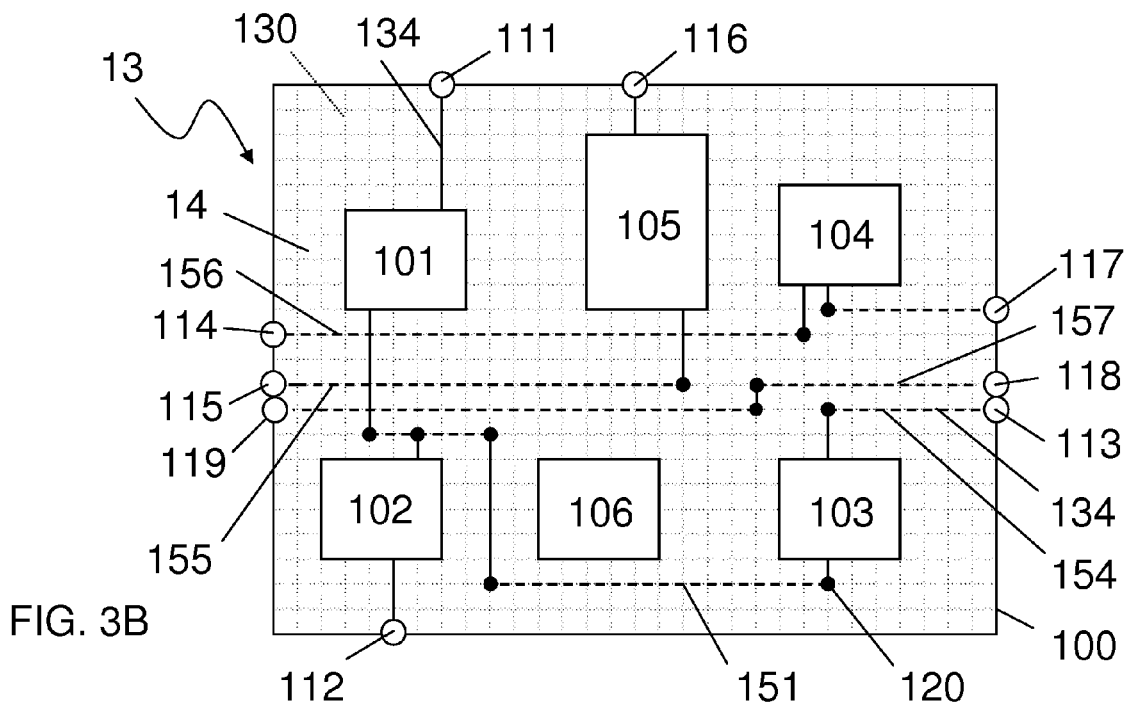
FIG. 3B the area of FIG. 3A after rerouting.

An evaluation of a reference wiring quality of critical area 14 can be carried out in various ways. In a preferred embodiment of the invention, reference wiring is obtained by calculating the Manhattan distance for all internal and partial nets within critical area 14. As an example, FIG. 3B shows a Manhattan distance reference wiring 151 of net 131. This Manhattan reference wiring 151 of net 131 has a wiring length of 31 units and contains five vias joining five segments of wiring. Manhattan distance reference wiring 151 of internal net 131 (FIG. 3B) thus has a considerably smaller length, less vias and less segments than actual wiring 141 of net 131 (FIG. 3A). Manhattan distance reference wiring 154 of partial net 134, as shown in FIG. 3B has a wiring length of nine units, one via and two segments of wiring, same as the actual wiring implementation 144 of partial net 134 shown in FIG. 3A; thus actual wiring implementation 144 of net 134 corresponds to Manhattan distance reference wiring 154. Note that the position of transition points 111 through 119 remain unchanged from FIG. 3A to FIG. 3B, so that for partial nets (i.e. nets with sinks or sources outside critical area 14) Manhattan distance reference routing can only be carried out for those fractions of the partial nets which are located within critical area 14.

Following the examples of nets 131 and 134, Manhattan distance reference wiring can be calculated for all internal and partial nets in critical area 14. A small and fast router is applied which has highest priority to follow Manhattan distance and thus straighten the nets. This leads to a rerouting of critical area 14, resulting in nets which will follow Manhattan distance wherever possible. In practice, all or selected wiring in critical area 14 is deleted and replaced by wiring which follows (or at least approaches) Manhattan routing. This rerouting reduces via count in critical area 14 and accumulates spread out wiring resources into bigger chunks. Note that no change in the placement of the circuits 101-106 within the critical area 14 nor the transition points 111-119 takes place during this rerouting process.

As a consequence of the rerouting, formerly wasted space is regained, thus freeing up resources for additional wiring. Note that as a consequence of this rerouting, the wire segment originating from transition point 118, which in FIG. 3A formed an unconnect, is now properly connected to transition point 119, forming a valid implementation 157 of net 137; this is due to the fact that—in contrast to FIG. 3A—transition point 119 is not blocked any more. Wires running through critical area 14 connecting two transition points (i.e. without sinks or sources in critical area 14) will also be corrected to follow Manhattan distance.

After rerouting the critical area 14 as described above, a detailed routing step covering neighboring regions of critical area 14 can be carried out, cleaning up leftover unconnected nets extending out of critical region 14.

The preferred embodiment described above uses Manhattan routing as a reference for evaluating wiring quality of critical area 14 containing mesh 13, analyzing the nets within critical area 14 with respect to the amount of segments and the via count. Note that rerouting is not based on nets, but based on reducing vias and straightening segments of a net within critical area 14. Different distance measures, e.g. minimum rectilinear Steiner tree (MRST) or non-rectilinear Steiner tree, can be used in calculating reference wiring. Also, aside from wiring length, segments and vias, different or additional net parameters, such as the number of wiring layers of nets etc., can be used to influence the way in which wiring is placed during rerouting.

Figure 4:
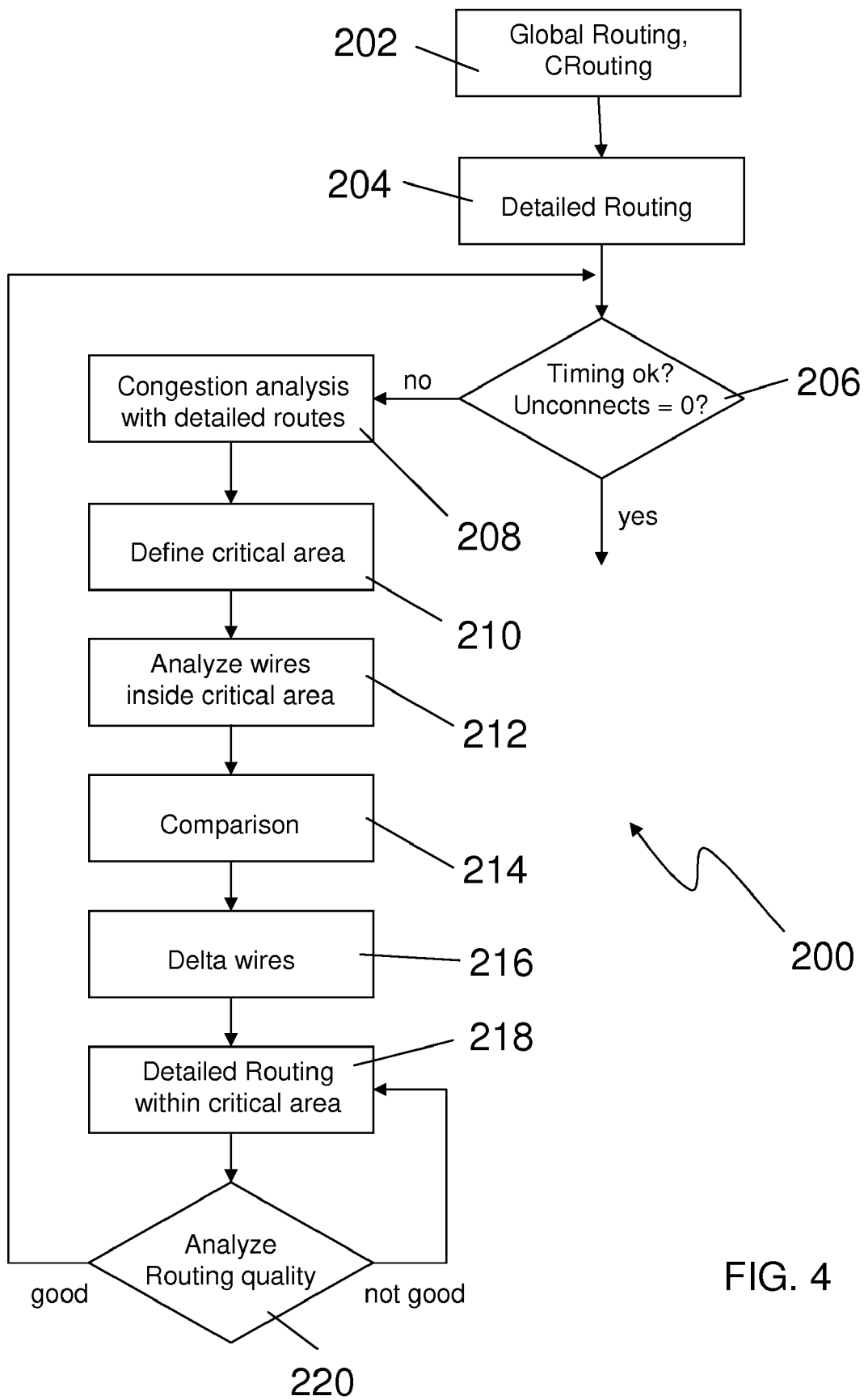
FIG. 4 a method flow diagram of a preferred embodiment of the invention.

Referring now to FIG. 4, a method flow diagram 200 of the preferred embodiment of the invention described above is shown. The method sets out from a placed and globally routed (and potentially also crouted) design 202 of cells on a chip. After detailed routing 204, a simulation of the design 206 is carried out, yielding critical parameters of the design (such as timing, number and location of unconnects etc.). If critical parameters are not satisfactory, an analysis 208 of the routed design is performed to identify locally congested areas (meshes 13), and a critical area 14 containing a mesh 13 is defined 210; in these steps 208, 210, congestion information gained during global routing 202 may be used to facilitate localization of meshes. Subsequently, an analysis 212 of wiring quality within the critical area 14 containing mesh 13 is carried out. This analysis may encompass computation of total wiring length, number of vias, number of segments etc. of internal and partial nets within critical area 14. In subsequent step 214, actual wiring quality evaluated in step 212 is compared to a reference wiring quality within critical area 14. In a preferred embodiment, reference wiring quality is determined based on a Manhattan routing of critical area, and difference 214 is evaluated by calculating difference in via count and/or number of segments between actual wiring and reference (Manhattan) routing of critical area 14.

Depending on the difference 214 between reference wiring quality and actual wiring quality, a detailed rerouting 218 is carried out within critical area 14. In a preferred embodiment, this rerouting 218 entails removing all or selected wiring within critical area 14 and rerouting critical area with a high priority given to Manhattan distance; thus rerouting 218 of selected low quality nets is carried out in such a way as to replace actual wiring by Manhattan wiring within area 14, thus reducing via count as well as number of segments within area 14. Analysis 220 of rerouted area 14 yields a measure of wiring quality in critical area after rerouting. If wiring quality is inadequate, detailed routing step 218 within critical area 14 is repeated; if wiring quality is adequate, simulation 206 of the design is repeated to determine whether critical parameters of the design (such as timing, number and location of unconnects etc.) meet specification.

Figure 5A:
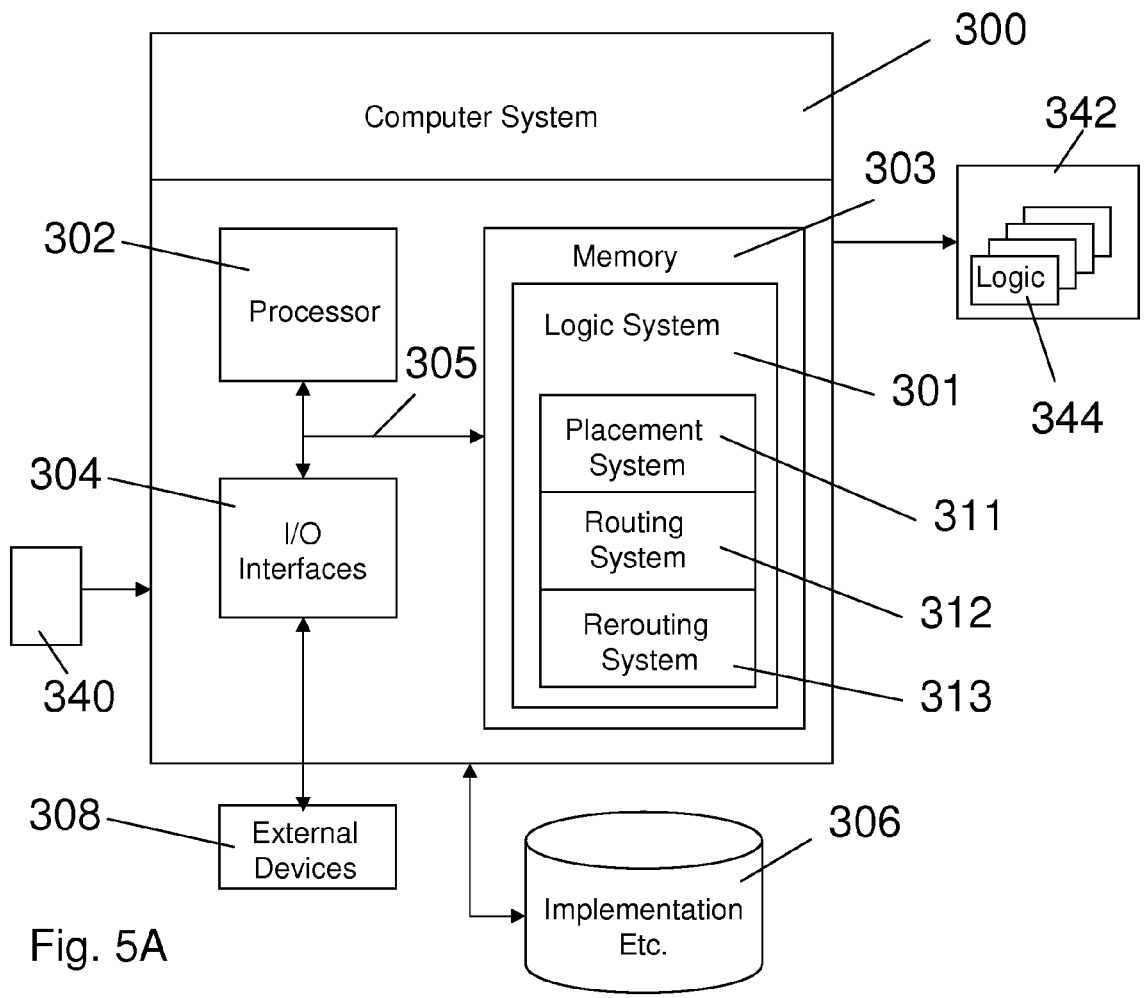
FIG. 5A a computer system implementation of the present invention.

Referring now to FIG. 5A, a computer system 300 implementation of the present invention is shown. Specifically, the present invention can be implemented as a computer system 300 and/or program product 301 for placing and routing electric circuits in integrated circuit chip design. This allows user 340 to run simulations before manually performing logic placement. As depicted, computer system 300 generally comprises a processor subsystem 302, a memory 303, an input/output (I/O) interface 304, a bus subsystem 305, a database 306 as well as external devices 308.

Processor subsystem 302 encompasses the central processing unit (CPU) as well as any secondary processing devices, for example arithmetic processing unit, coupled to the CPU by the bus subsystem 305. Processor subsystem may comprise a single processing unit, or be distributed across one or more processing units in one or more locations, e.g., on a client and server. Memory 303 may comprise any known type of data storage and/or transmission media, including magnetic media, optical media, random access memory (RAM), read-only memory (ROM), a data cache, a data object, etc. Moreover, memory 303 may reside at a single physical location, comprising one or more types of data storage, or be distributed across a plurality of physical systems in various forms.

I/O interface 304 may comprise any system for exchanging information from an external source. External devices 308 may comprise any known type of external device, including speakers, a CRT, LED screen, hand-held device, keyboard, mouse, voice recognition system, speech output system, printer, monitor, facsimile, pager, etc. Bus 305 provides a communication link between each of the components in the computer system 300 and likewise may comprise any known type of transmission link, including electrical, optical, wireless, etc. In addition, although not shown, additional components, such as cache memory, communication systems, system software, etc., may be incorporated into computer system 300.

Database 306 provides storage for information necessary to carry out the present invention. Such information could include, inter alia: (1) congestion data; (2) potential implementations; (3) wiring quality data; etc. Database 306 may include one or more storage devices, such as a magnetic disk drive or an optical disk drive. In another embodiment database 306 includes data distributed across, for example, a local area network (LAN), wide area network (WAN) or a storage area network (SAN) (not shown). Database 306 may also be configured in such a way that one of ordinary skill in the art may interpret it to include one or more storage devices. Moreover, it should be understood that database 306 could alternatively exist within computer system 300.

Stored in memory 303 is logic system 310. As depicted, logic system 310 generally includes Placement System 311, Routing System 312 (comprising global routing system and detailed routing system) Rerouting System 313. The systems shown herein carry out the functions described above.

Figure 5B:
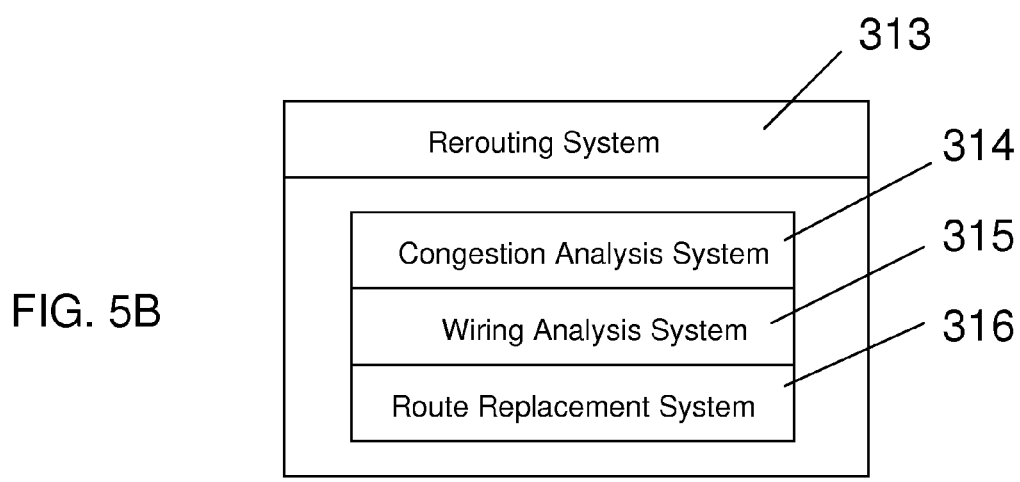
FIG. 5B a detailed view of a rerouting system within the computer system of FIG. 5A.

As shown in FIG. 5B, Rerouting System 313 comprises Congestion Analysis System 314, Wiring Analysis System 315 and Route Replacement System 316. Congestion Analysis System 314 will analyze wiring congestion of the routed electric circuits as provided by Routing System 312 and will pinpoint critical areas 14. Wiring Analysis System 315 will compare wiring quality in critical area 14 to a reference wiring quality in this critical area 14. Route Replacement System 316 will reroute nets in critical area.

Each of the software modules 311 through 316 is comprised of a set of instructions which are encoded in memory 303 as computer readable program code and executable by processor subsystem 302. Typically, the software modules 311 through 316 will be stored in auxiliary memory of memory subsystem 303 prior to the execution thereof. External device 308, e.g. a CD-ROM or file transfer software, is used to copy the modules 311 through 316 into the auxiliary memory of memory subsystem 303.

The functionality provided by the software modules 311 through 316 may be encoded in the memory 303 and/or in computer usable medium as discrete programs, each containing computer readable program code. Alternately, the functionality provided by the software modules 311 through 316 may be encoded in the memory 303 and/or in computer usable medium as separate subroutines of a single computer program containing plural computer readable program subcodes. Furthermore, while any of the software modules 311 through 316 may be executed separately, typically the Placement module 311 will be initially executed by the processor 303, followed by Routing module 312 and Rerouting system 313. Based on the results of Routing module 312, Congestion Analysis module 314 will call Wiring Analysis module 315 and Route Replacement module 316 to reroute critical area with wiring congestion. Of course, any of the software modules 311 through 316 may call any other one of the software modules 311 through 316 to perform certain functions on its behalf.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer readable medium providing program code for use by or in connection with a computer or any instruction execution system. For the purposes of this description, a computer-usable or computer readable medium can be any apparatus that can contain, store, communicate, propagate, or transport the program for use by on in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

The invention claimed is:

1. A method for routing electric circuits in an integrated circuit chip design, comprising the steps of using a computer for:
   performing a congestion analysis for a given routed placement of cells containing said electric circuits on a chip;
   defining a critical area on said chip based on congestion information;
   analyzing an actual wiring quality within said critical area;
   comparing the actual wiring quality of said critical area with a reference wiring quality of said critical area;
   rerouting said critical area based on a comparison between the actual wiring quality and the reference wiring quality.

2. The method of claim 1, characterized in that the step of defining a critical area comprises
- selecting a region of wiring congestion based on said congestion analysis;
- comparing a size of said region to a reference size;
- if the size of said region is less than or equal to the reference size, take said region as a critical area;
- if the size of said region exceeds the reference size, partitioning said region into several critical areas of size smaller than said reference size.

3. The method of claim 1, characterized in that the step of analyzing an actual wiring quality within said critical area comprises a via count in said critical area.

4. The method of claim 1, characterized in that the step of analyzing an actual wiring quality within said critical area comprises counting a number of wiring segments in said critical area.

5. The method of claim 1, characterized in that the step of analyzing an actual wiring quality within said critical area comprises calculating lengths of actual wirings wiring in complete and partial nets within said critical area.

6. The method of claim 1, characterized in that the step of comparing the actual wiring quality of said critical area with a reference wiring quality of said critical area comprises
- calculating Manhattan distances of nets within said critical area;
- comparing said Manhattan distances to actual wirings wiring of nets within said critical area;
- selecting nets for rerouting based on a comparison result of the step of comparing.

7. The method of claim 1, characterized in that the step of rerouting said critical area comprises
- selecting nets within said critical area for replacement based on said comparison between the actual wiring quality and the reference wiring quality;
- replacing an actual wiring in said selected nets by a reference wiring.

8. The method of claim 7, characterized in that said nets within said critical area comprise complete and partial nets.

9. A system for placing and routing electric circuits in an integrated circuit chip design, comprising
- a placement system for placing cells containing said electric circuits on a chip;
- a routing system for global routing of said cells placed on said chip and for detailed routing of said electric circuits;
- a rerouting system for rerouting a critical area on said chip according to a method of claim 1.

10. The system of claim 9, wherein the rerouting system comprises
- a congestion analysis system for defining a critical area on a chip based on congestion information;
- a wiring analysis system for analyzing a wiring quality within said critical area with respect to a reference wiring quality;
- a route replacement system for rerouting said critical area.

11. A data processing program for execution in a data processing system comprising software code portions for performing a method according to claim 1 when said program is run on said data processing system.

12. A program product stored on a non-transitory computer usable medium comprising computer readable program means for causing a computer to perform a method according to claim 1 when said program is run on said computer.

13. A method for routing electric circuits in an integrated circuit chip design, comprising the steps of using a computer for:
- performing a placement process of cells containing said electric circuits on a chip;
- performing a routing process;
- performing a congestion analysis on the routed electric circuits on said chip;
- defining a critical area based on information obtained in said congestion analysis;
- comparing a wiring quality in said critical area to a reference;
- rerouting said critical area.

14. A program product stored on a non-transitory computer usable medium comprising computer readable program means for routing electric circuits placed on a chip, wherein the computer readable program when executed on a computer causes the computer to
- perform a congestion analysis on the routed electric circuits on said chip;
- define a critical area on said chip based on congestion information;
- analyze an actual wiring quality within the critical area with respect to a reference wiring quality;
- reroute the critical area.

* * * * *